United States Patent
Weber et al.

(10) Patent No.: US 9,905,639 B2
(45) Date of Patent: Feb. 27, 2018

(54) METHOD OF MANUFACTURING SUPERJUNCTION SEMICONDUCTOR DEVICES WITH A SUPERSTRUCTURE IN ALIGNMENT WITH A FOUNDATION

(71) Applicant: Infineon Technologies Austria AG, Villach (AT)

(72) Inventors: Hans Weber, Bayerisch Gmain (DE); Christian Fachmann, Fuernitz (AT); Daniel Tutuc, St. Niklas an der Drau (AT); Andreas Voerckel, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/361,219

(22) Filed: Nov. 25, 2016

(65) Prior Publication Data

US 2017/0154956 A1     Jun. 1, 2017

(30) Foreign Application Priority Data

Nov. 26, 2015   (DE) .......................... 10 2015 120 510

(51) Int. Cl.
| | |
|---|---|
| *H01L 29/06* | (2006.01) |
| *H01L 21/308* | (2006.01) |
| *H01L 29/66* | (2006.01) |
| *H01L 29/423* | (2006.01) |
| *H01L 21/027* | (2006.01) |
| *H01L 21/66* | (2006.01) |
| *H01L 23/544* | (2006.01) |

(52) U.S. Cl.
CPC ...... *H01L 29/0634* (2013.01); *H01L 21/0274* (2013.01); *H01L 21/3081* (2013.01); *H01L 22/12* (2013.01); *H01L 23/544* (2013.01); *H01L 29/4236* (2013.01); *H01L 29/66666* (2013.01); *H01L 2223/54426* (2013.01)

(58) Field of Classification Search
CPC ............... H01L 29/0634; H01L 23/544; H01L 29/66734; H01L 29/4236; H01L 29/7813
See application file for complete search history.

(56) References Cited

U.S. PATENT DOCUMENTS

| | | | |
|---|---|---|---|
| 2003/0119274 A1* | 6/2003 | Weis | ............... H01L 21/823487 438/401 |
| 2011/0294278 A1 | 12/2011 | Eguchi et al. | |
| 2014/0106520 A1* | 4/2014 | Yamaguchi | ........... H01L 23/544 438/198 |
| 2014/0231904 A1* | 8/2014 | Willmeroth | ....... H01L 29/66734 257/330 |
| 2015/0044854 A1 | 2/2015 | Lee et al. | |

FOREIGN PATENT DOCUMENTS

CN         104658889 A     5/2015

* cited by examiner

*Primary Examiner* — Walter H Swanson
(74) *Attorney, Agent, or Firm* — Murphy, Bilak & Homiller, PLLC

(57) ABSTRACT

By using a single trench mask, first and second trenches are formed that extend from a main surface into a semiconductor layer. A foundation is formed that includes first regions in and/or directly adjoining the first trenches. A superstructure is formed in alignment with the foundation by using position information directly obtained from structures formed in the first and/or the second trenches.

15 Claims, 17 Drawing Sheets

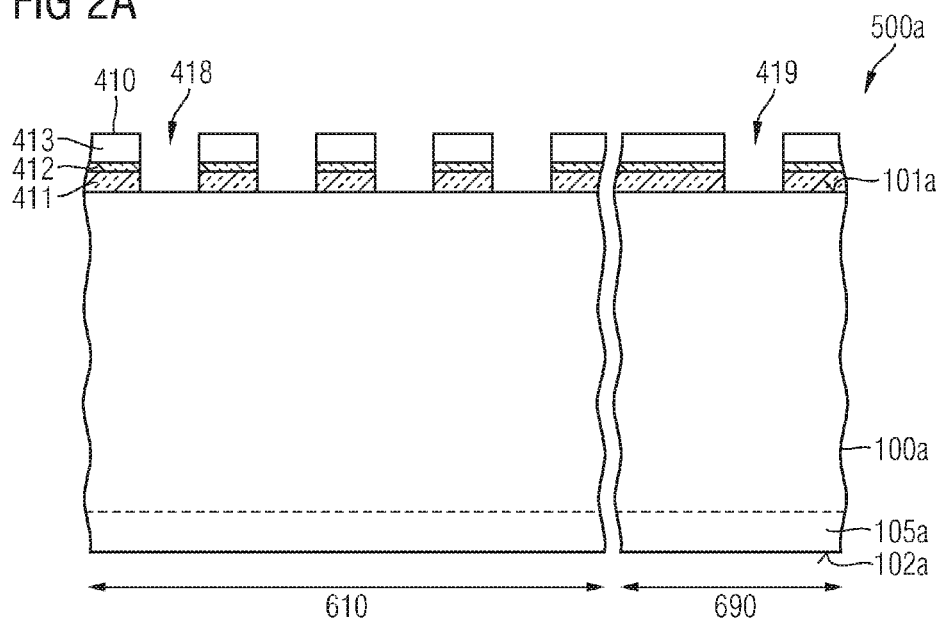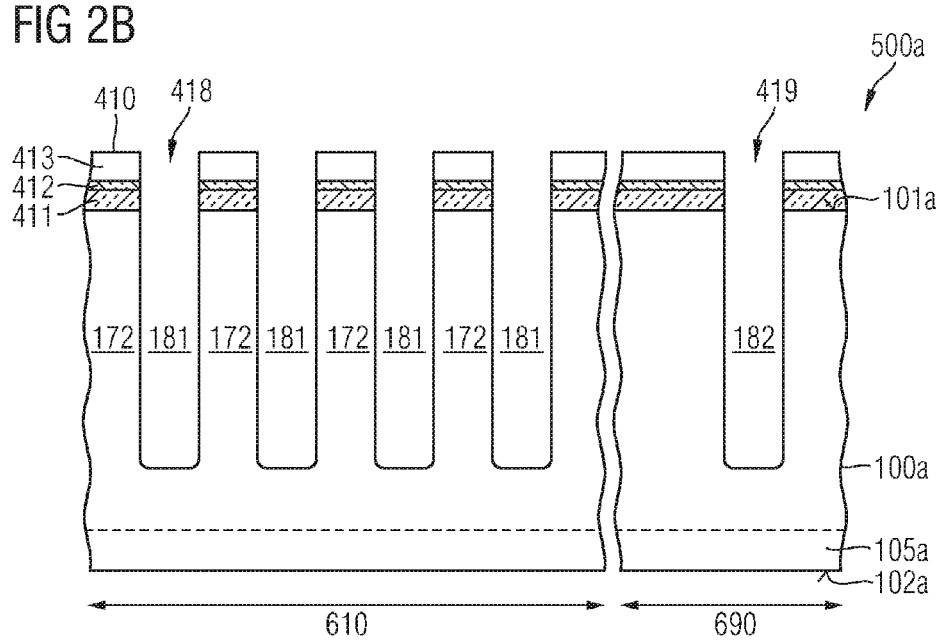

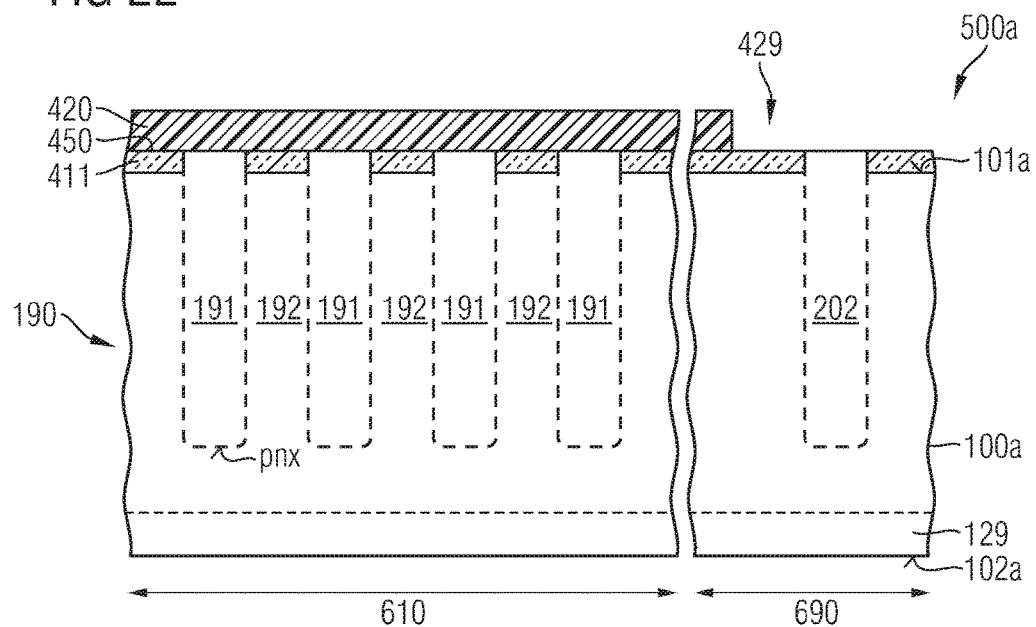
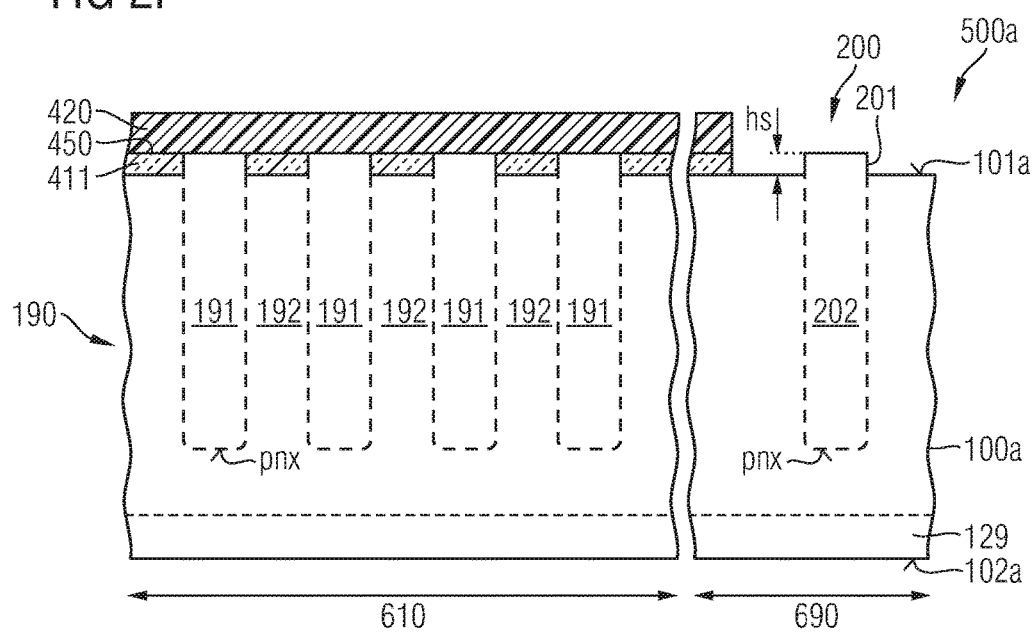

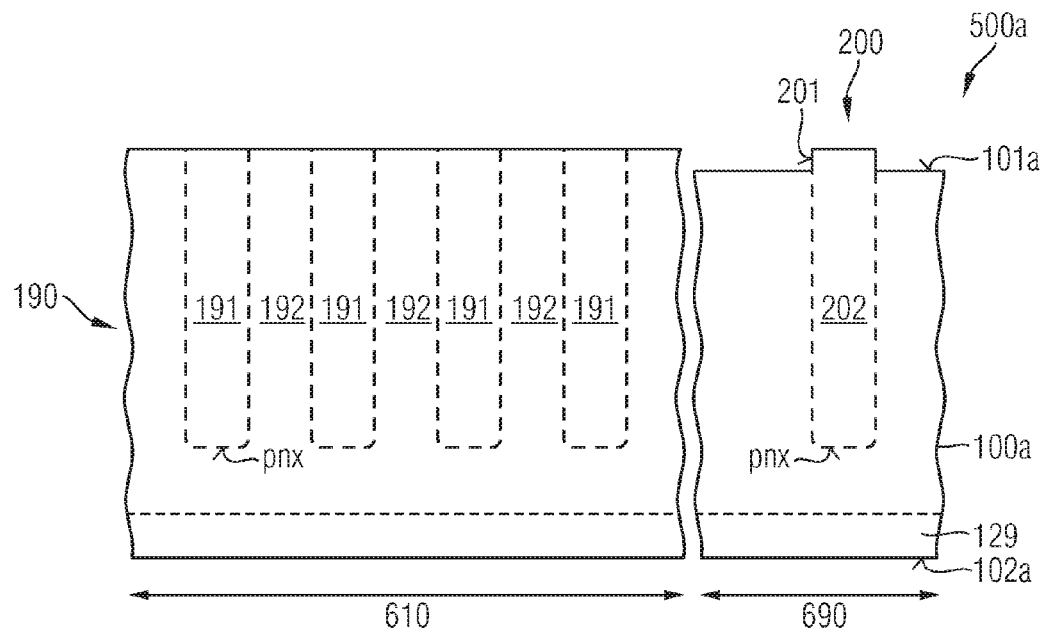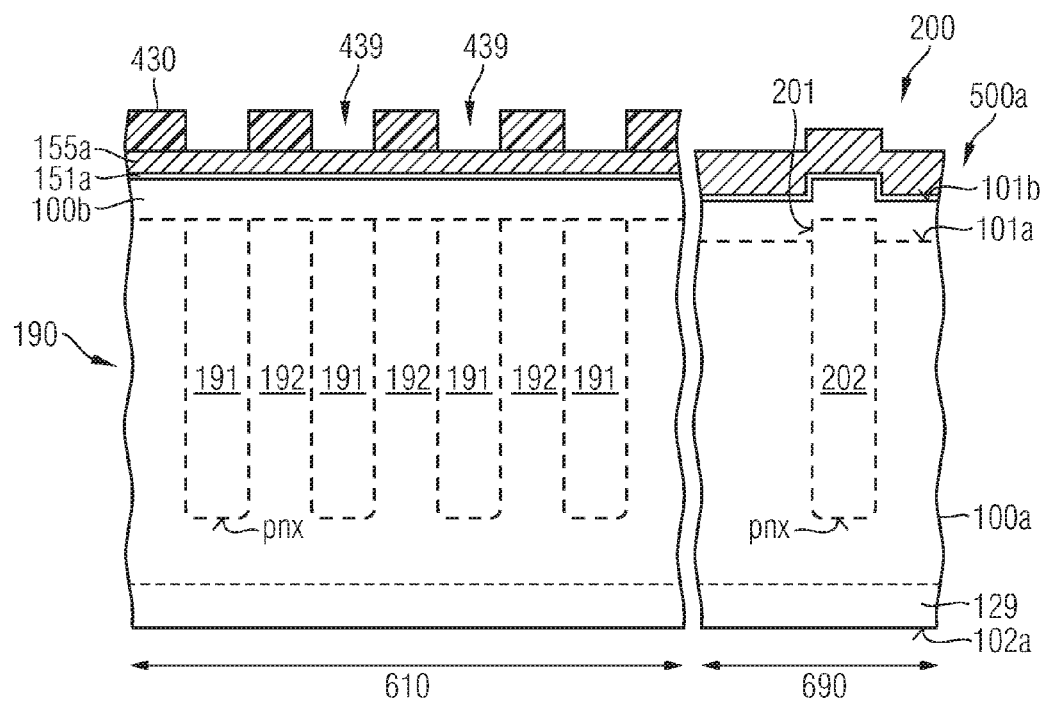

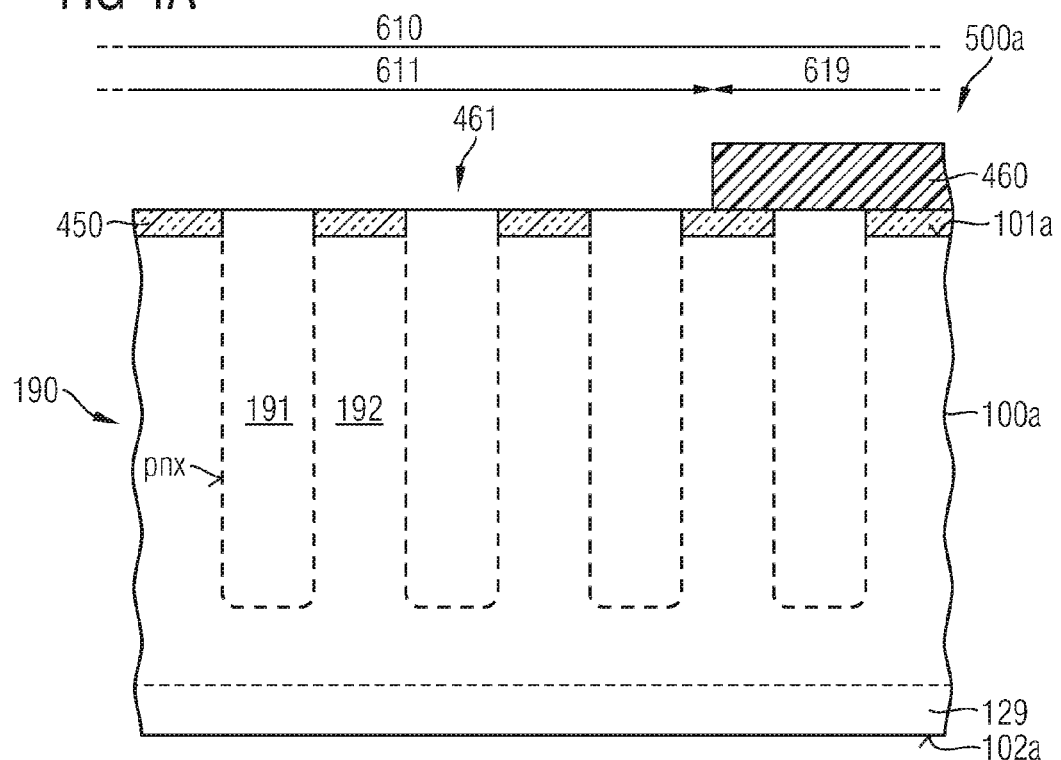
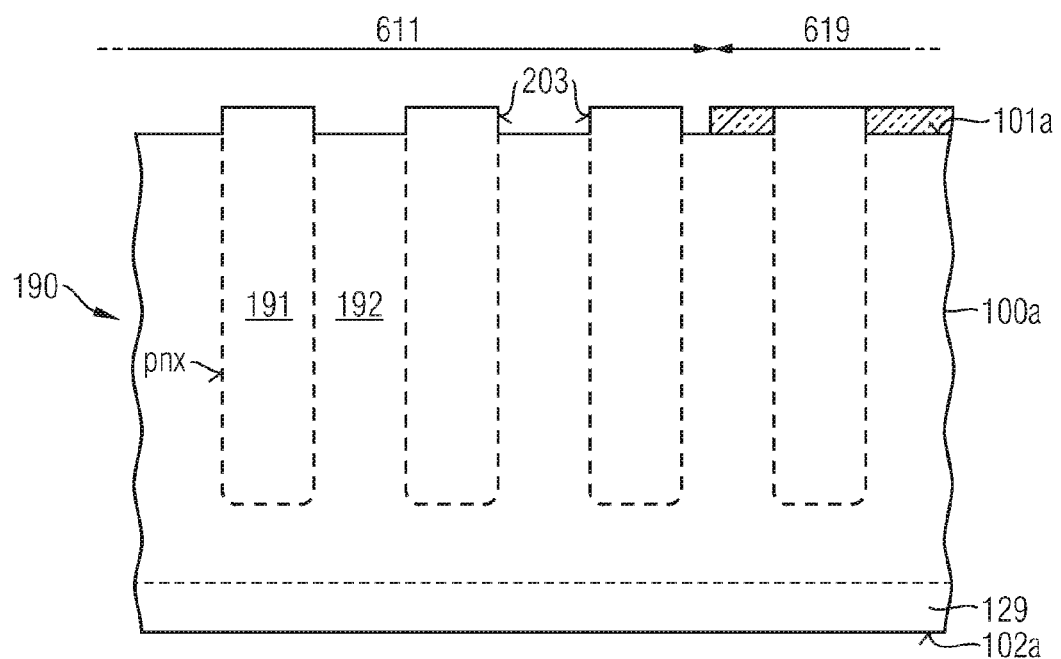

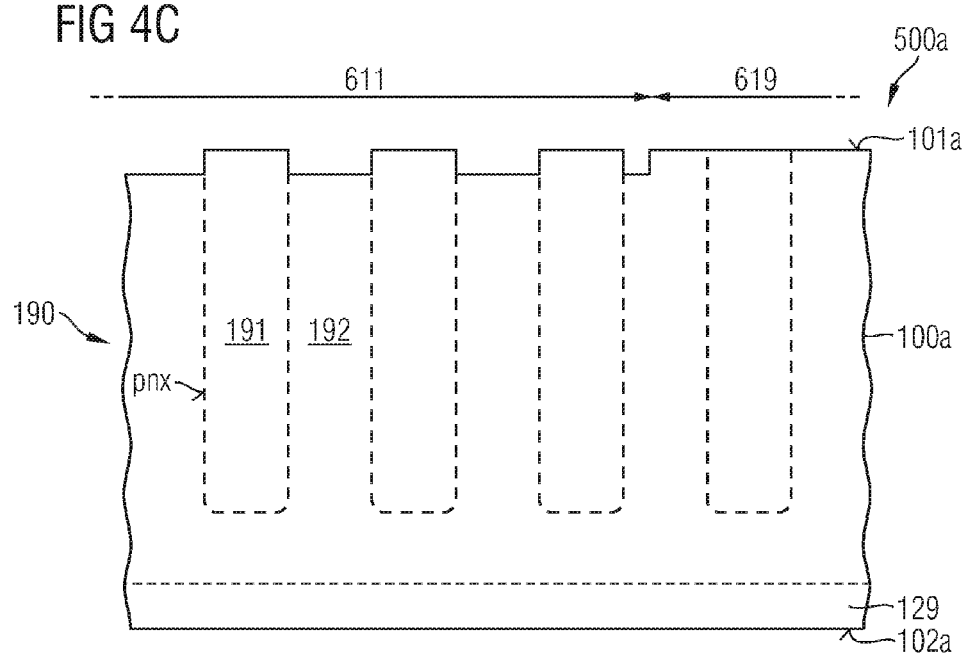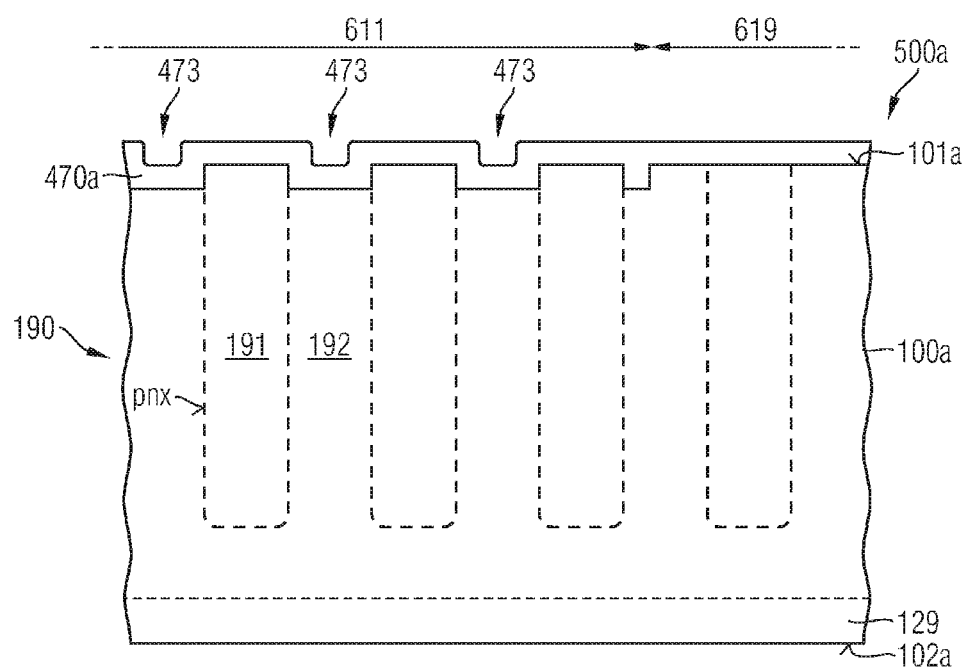

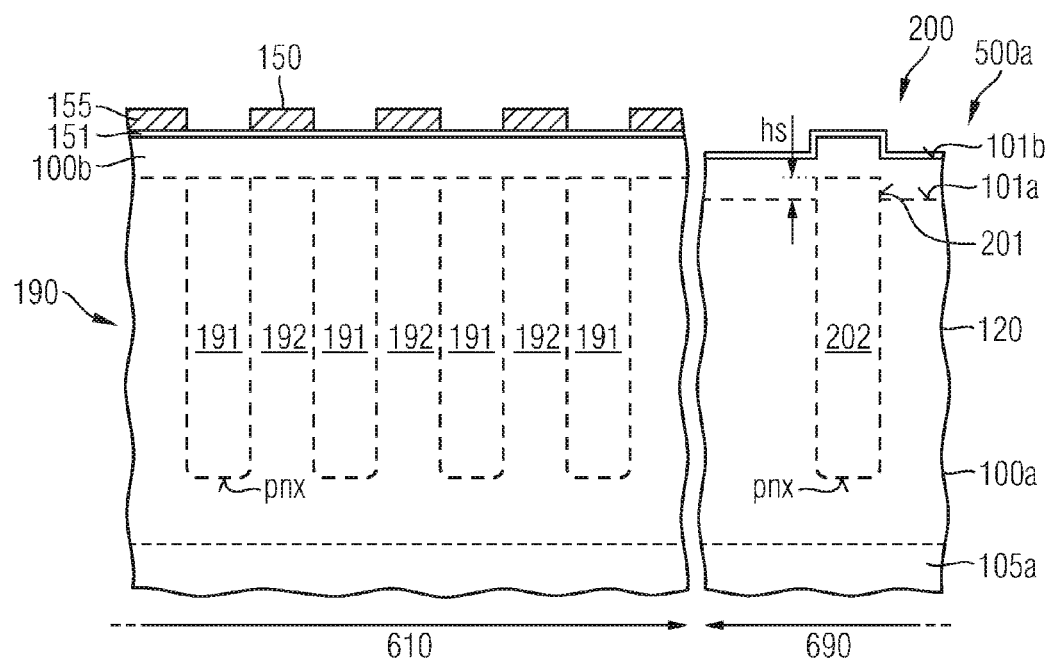

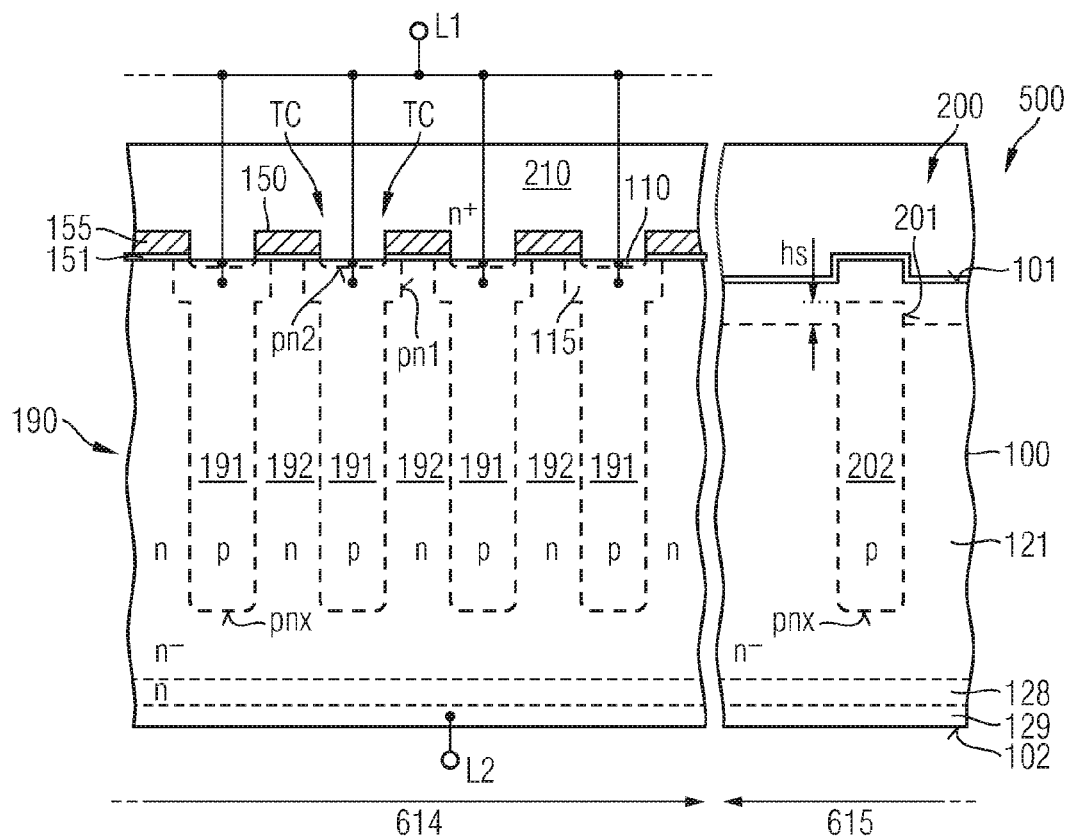

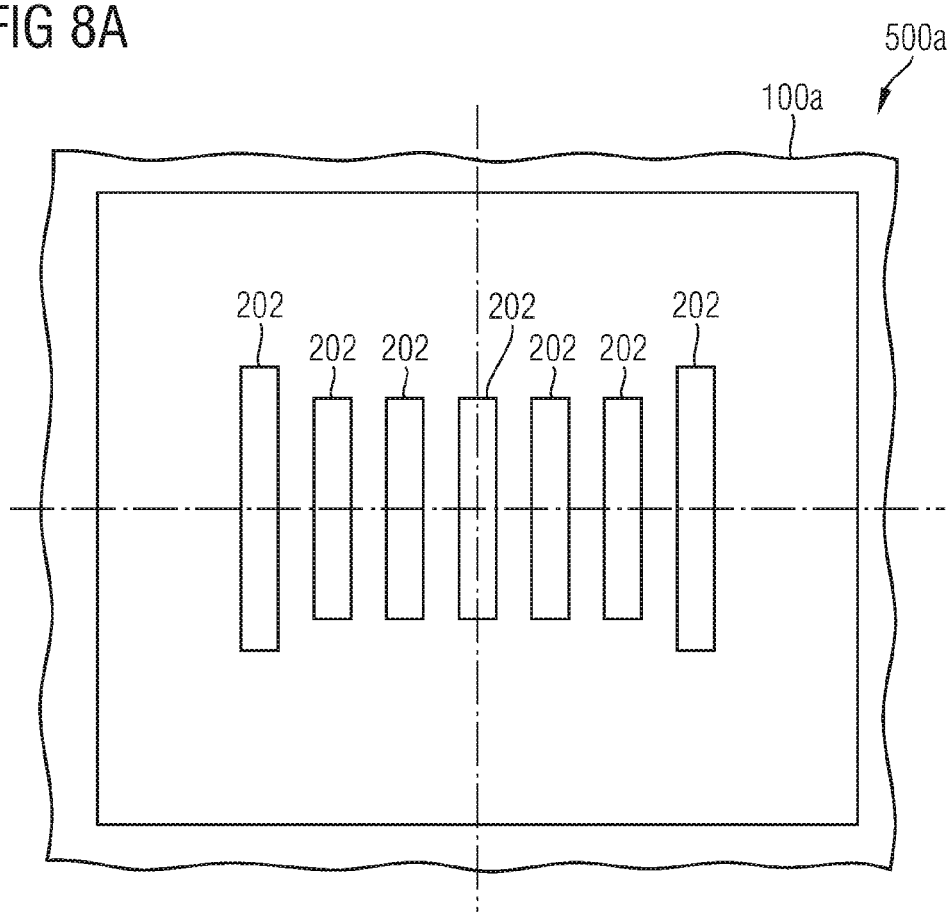

METHOD OF MANUFACTURING SUPERJUNCTION SEMICONDUCTOR DEVICES WITH A SUPERSTRUCTURE IN ALIGNMENT WITH A FOUNDATION

BACKGROUND

In superjunction semiconductor devices complementary doped first and second semiconductor regions alternate along at least one horizontal direction in a drift layer. The doping concentrations in the first and second semiconductor regions are adjusted to each other such that even at comparatively high dopant concentrations in the superjunction structure a portion of the drift layer including the superjunction structure can be completely depleted in a blocking state of the semiconductor device. A semiconductor device with high dopant concentration in portions of the drift layer shows comparatively low on-state resistance.

Superjunction structures may be formed by etching trenches into a semiconductor layer of a first conductivity type and filling the trenches with semiconductor material of the complementary second conductivity type. After formation of the superjunction structure, a superstructure including transistor cells may be formed in a semiconductor layer above the superjunction structure. For aligning the transistor cells to the superjunction structure, an alignment mark is formed before or after the formation of the superjunction structure.

It is desirable to align a superstructure to a foundation, which includes a superjunction structure, in a reliable and economic way.

SUMMARY

According to an embodiment a method of manufacturing a semiconductor device includes forming first and second trenches that extend from a main surface into a semiconductor layer, wherein a single trench mask is used to form both the first and the second trenches. A foundation including first regions in and/or directly adjoining to the first trenches is formed. A superstructure is formed in alignment with the foundation, wherein position information is directly obtained from structures formed in at least one of the first and second trenches.

According to another embodiment, a semiconductor substrate includes a superjunction structure in a device region of a semiconductor layer, wherein the superjunction structure includes first regions and second regions of an opposite conductivity type, wherein the first and second regions alternate along at least one horizontal direction. An alignment mark in a kerf region of the semiconductor layer includes vertical steps formed by a portion of an alignment structure projecting or recessed from a main surface of the semiconductor layer. The alignment structure is of the material of the first regions of the superjunction structure.

According to another embodiment, a semiconductor device includes a superjunction structure in an active region of a semiconductor portion, wherein the superjunction structure includes first regions and second regions of an opposite conductivity type and wherein the first and second regions alternate along at least one horizontal direction. An alignment mark in an inactive region of the semiconductor portion includes vertical steps formed by a portion of an alignment structure projecting or recessed from a first surface of the semiconductor portion. The alignment structure is of the material of the first regions of the superjunction structure.

According to a further embodiment a method of manufacturing a semiconductor device includes forming, by using a single trench mask, first and second trenches that extend from a main surface into a semiconductor layer. A foundation is formed that includes a superjunction structure. The superjunction structure includes doped first regions in and/or directly adjoining to the first trenches and oppositely doped second regions. The first and second regions alternate along at least one horizontal direction parallel to the main surface. A superstructure is formed that is in alignment with the foundation, wherein position information is used that is directly obtained from structures formed in at least one of the first and the second trenches.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic vertical cross-sectional view of a portion of a semiconductor substrate for illustrating a method of manufacturing a superjunction semiconductor device according to an embodiment using a contrast-enhanced alignment mark based on second trenches formed contemporaneously with first trenches provided for the formation of a superjunction structure, after forming a trench mask.

FIG. 2B is a schematic vertical cross-sectional view of the semiconductor substrate portion of FIG. 2A, after etching, by using the trench mask, both first and second trenches.

FIG. 2E is a schematic vertical cross-sectional view of the semiconductor substrate portion of FIG. 2D, after formation of a device mask exposing a second portion of the trench mask around the second trenches.

FIG. 2F is a schematic vertical cross-sectional view of the semiconductor substrate portion of FIG. 2E, after forming a contrast-enhanced alignment mark by selective removal of the second portion of the trench mask around the second trenches.

FIG. 2G is a schematic vertical cross-sectional view of the semiconductor substrate portion of FIG. 2F, after complete, non-selective removal of a first portion of the trench mask.

FIG. 2H is a schematic vertical cross-sectional view of the semiconductor substrate portion of FIG. 2G, after forming a gate mask, wherein position information obtained from the contrast-enhanced alignment mark is used for aligning an exposure mask for the gate mask.

FIG. 4A is a schematic vertical cross-sectional view of a portion of a semiconductor substrate for illustrating a method of manufacturing a superjunction semiconductor device using position information directly derived from a material-selective etch process effective on structures in first trenches provided for the formation of a superjunction structure, after forming a transistor cell area mask.

FIG. 4B is a schematic vertical cross-sectional view of the semiconductor substrate portion of FIG. 4A, after removing a second portion of a trench mask exposed by the transistor cell area mask.

FIG. 4C is a schematic vertical cross-sectional view of the semiconductor substrate portion of FIG. 4B, after complete, non-selective removal of the trench mask.

FIG. 4D is a schematic vertical cross-sectional view of the semiconductor substrate portion of FIG. 4C, after depositing a conformal mask layer.

FIG. 6 is a schematic vertical cross-sectional view of a semiconductor substrate with a plurality of device regions for superjunction semiconductor devices according to an embodiment with a contrast-enhanced alignment mark in a kerf region.

FIG. 7 is a schematic vertical cross-sectional view of a semiconductor device according to an embodiment with a contrast-enhanced alignment mark in an inactive region.

FIG. 8A is a schematic plan view of an alignment mark with parallel alignment structures according to an embodiment.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
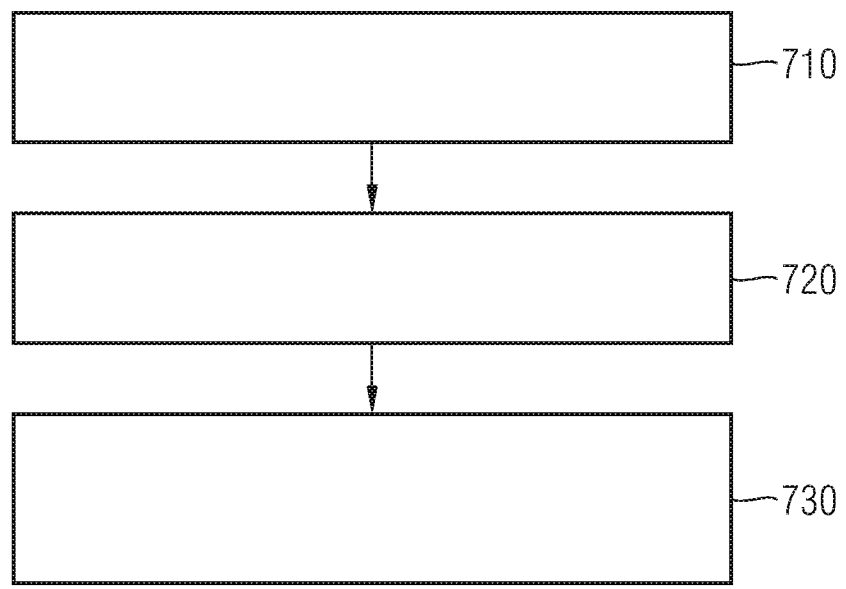
FIG. 1 is schematic flowchart of method of manufacturing a superjunction semiconductor device according to an embodiment using position information directly derived from structures that are formed in trenches provided for the formation of the superjunction structure or formed contemporaneously with trenches provided for the formation of the superjunction structure.

FIG. 1 illustrates a method of manufacturing a superjunction semiconductor device according to the embodiments.

The superjunction semiconductor device may be or may include a power semiconductor diode, an IGFET (insulated gate field effect transistor), for example an MOSFET (metal oxide semiconductor field effect transistor) in the usual meaning including FETs with metal gates and FETs with semiconducting gates, or an IGBT (insulated gate bipolar transistors).

By using a single trench mask, trenches are formed that extend from a main surface into a semiconductor layer of crystalline semiconductor material such as silicon (Si) (710). First regions are formed in and/or directly adjoining to the first trenches (720). The first regions may be or may include insulating, semiconducting or highly conductive structures. According to an embodiment, the first regions may be or may include semiconducting sections of the semiconductor layer 100a temporarily accessible through the trenches. According to other embodiments, the first regions may be or may include semiconducting structures formed by filling the trenches with doped or intrinsic semiconductor material.

The first regions are part of a foundation. By using position information directly derived from structures formed in the trenches, a superstructure, which may include transistor cells, is formed in alignment with the foundation (730).

Each photolithography process defines functional structures such as insulator structures, conductive structures or semiconducting regions of semiconductor elements, either in the foundation or in the superstructure. Critical photolithography processes that define alignment marks not only define an alignment mark but also functional structures. The process gets along without any critical lithography process that exclusively defines a non-functional structure such as an alignment mark.

According to an embodiment an optical response of a structure formed in at least a second one of the trenches may be evaluated for aligning the superstructure to the foundation. In this way, the position information about placement of the foundation is directly derived from the structure in the at least one second trench. According to another embodiment the position information may be directly derived from steps formed along sidewalls of structures formed in at least some of the first trenches provided for the formation of the superjunction structure.

The first regions formed in the first trenches may form or may be part of a superjunction structure. Other than approaches providing an alignment mark prior to formation of the superjunction structure and aligning both the foundation including the superjunction structure and the superstructure including transistor cells to the alignment mark, the position information signal is not extenuated by planarizing processes effective on the semiconductor layer including the superjunction structure, e.g., for removing excess fill material for the trenches. Instead, the present embodiments use a high-contrast signal that is directly based on the superjunction structure or on an alignment mark that may be formed as an extension of the superjunction structure.

Other than a process using alignment marks formed after the formation of the superjunction structure and in alignment to the superjunction structure, the process for forming the superstructure is directly aligned to the superjunction structure and hence an inherent statistical misalignment is reduced by factor $\sqrt{2}$.

FIGS. 2A to 2I refer to a method of manufacturing a superjunction semiconductor device by aligning a superstructure including transistor cells to an alignment mark 200 which is formed contemporaneously with a superjunction structure 190 in a foundation in a semiconductor substrate 500a.

The semiconductor substrate 500a has a main surface 101a at a front side. A distance between the main surface 101a and a rear surface 102a on the back of the semiconductor substrate 500a may reach several hundred μm. Directions parallel to the main surface 101a are horizontal directions and a direction perpendicular to the main surface 101a is a vertical direction.

The semiconductor substrate 500a may consist of or may include a semiconductor layer 100a of a crystalline semiconductor material such as single-crystalline silicon (Si), germanium (Ge), a silicon-germanium (SiGe) crystal, silicon carbide (SiC) or an $A_{III}B_V$ semiconductor. The semiconductor substrate 500a may include further conductive, dielectric or semiconducting portions. For example, the semiconductor layer 100a is an n-doped epitaxial layer formed on a substrate portion 105a obtained from a semiconductor ingot, wherein the substrate portion 105a may form a homojunction, for example a unipolar homojunction or a pn junction, with the semiconductor layer 100a.

The semiconductor layer 100a may be homogeneously doped with dopants of the same type or with complementary dopants or may include portions of different dopant concentrations for at least one dopant type. For example, the semiconductor layer 100a may include portions in which the net dopant concentration increases or decreases with decreasing distance to the main surface 101a.

A trench mask layer is formed on the main surface 101a. The trench mask layer may consist of one single homogeneous layer or may be a layer stack including two or more layers of different materials.

The trench mask layer is patterned by photolithography to form a trench mask 410 with first mask openings 418 in a device region 610 and second mask openings 419 in a scribe line or kerf region 690. The device region 610 corresponds to portions of the semiconductor substrate 500a from which semiconductor dies for semiconductor devices are obtained. The kerf region 690 forms a grid with the device regions 610 forming the meshes. The kerf region 690 may be partly or completely consumed or discarded during a separation process which separates the semiconductor dies from the semiconductor substrate 500a.

FIG. 2A shows the trench mask 410 with the first mask openings 418 in the device region 610 and the second mask openings 419 in the kerf region 690. The trench mask 410 may include a first mask layer 411, which may be a silicon oxide layer. For example, the first mask layer 411 may contain or consist of thermally grown silicon oxide, deposited silicon oxide, for example silicon oxide deposited by LPCVD (low pressure chemical vapor deposition) using TEOS (tetraethylorthosilicate) as precursor material and densified in a heating treatment. A second mask layer 412 may be formed from a material of high etch selectivity against the material of the first mask layer 411. According to an embodiment, the second mask layer 412 contains or consists of silicon nitride. A third mask layer 413 may be a further silicon oxide layer or a silicate glass layer, for example, BSG (boron silicate glass), PSG (phosphorus silicate glass) or BPSG (boron phosphorus silicate glass), by way of example.

The first mask openings 418 may form a regular pattern of stripes or dots, wherein a first width of the dots in the horizontal plane is at most three times a second width of the dots orthogonal to the first width and wherein horizontal cross-sections of the dots may be circles, ellipses, ovals, distorted polygons or regular polygons such as octagons, hexagons or squares.

A center-to-center distance between neighboring first mask openings 418 may be in a range from 1 μm to 20 μm, for example in a range from 2 μm to 10 μm. A width of the first and second mask openings 418, 419 may be in a range from 500 nm to 10 μm, e.g., from 1 μm to 5 μm. A center-to-center distance between a pair of neighboring first and second mask openings 418, 419 may be at least five times a center-to-center distance between neighboring first mask openings 418.

The second mask openings 419 may have the same horizontal cross-sectional shape as the first mask openings 418. According to other embodiments, the second mask openings 419 may have different dimensions and the horizontal cross-sections may correspond to the cross-sections of conventional alignment marks. For example, the second mask openings 419 form a pattern including rectangular stripes with rounded and/or partially chamfered stripe ends and without intersections and branches, wherein the pattern may include two or more stripes arranged parallel to each other, as a cross, or along the outline of a rectangle, by way of example.

An etch process, e.g., reactive ion beam etching, uses the trench mask 410 to form first trenches 181 in a vertical projection of the first mask openings 418 in the device region 610 and second trenches 182 in the vertical projection of the second mask openings 419 in the kerf region 690.

Etching the first and second trenches 181, 182 may partially consume the third mask layer 413.

FIG. 2B shows the first and second trenches 181, 182, wherein in the device region 610 mesa portions 172 of the semiconductor layer 100a separate the first trenches 181 from each other. A vertical extension of the first and second trenches 181, 182 may be in a range from 5 µm to 100 µm, for example in a range from 20 µm to 50 µm.

First regions 191 may be formed in at least some of the first trenches 181 and/or in portions of the semiconductor layer 100a temporarily accessible through at least some of the first trenches 181. Second regions 192 may be formed in the mesa portions 172, in other ones of the first trenches 181 and/or in further portions of the semiconductor layer 100a accessible through other ones of the first trenches 181.

The first and second regions 191, 192 may consist of or may include insulating, semiconducting or highly-conductive materials. According to an embodiment, the first and second regions 192 are complementarily doped semiconducting regions and form a superjunction structure 190 in which charges contained in the first and second regions 191, 192 approximately cancel out each other.

For example, complementarily doped layers may be formed, e.g., deposited along sidewalls of the first trenches 181. The complementarily doped layers may fill the first trenches 181 completely or may leave a void in the center of each first trench 181, wherein the void may be filled with intrinsic semiconductor material and/or insulating material or wherein a cap may seal the void.

Alternatively, a section of the semiconductor layer 100a with a thickness corresponding to a vertical extension of the first trenches 181 may contain complementary dopants and the first and second regions 191, 192 are formed by a heat treatment after filling the trenches with, e.g., lightly doped or intrinsic semiconductor material, wherein different diffusion characteristics of the complementary dopants in the semiconductor layer 100a result in a partial separation of the complementary dopants.

According to a further embodiment the first regions 191 may be formed by filling neighboring first trenches 181 with complementarily doped semiconducting material.

According to the illustrated embodiment a superjunction structure 190 is formed by first regions 191 mainly formed in the first trenches 181 and by second regions 192 formed in the mesa portions 172 of the semiconductor layer 100a between the first trenches 181, wherein at first at least a portion of the trench mask 410 may be removed. For example, a wet etch may remove a remnant portion of the third mask layer 413 and the second mask layer 412. At least a portion of the first mask layer 411 may form an epitaxy mask 450 that covers surfaces of the mesa portions 172 in the main surface 101a. A selective epitaxy process may fill the first and second trenches 181, 182 as well as the first and second mask openings 418, 419 in the epitaxy mask 450 with a fill material, which may be doped, crystalline semiconductor material.

Figure 2C:
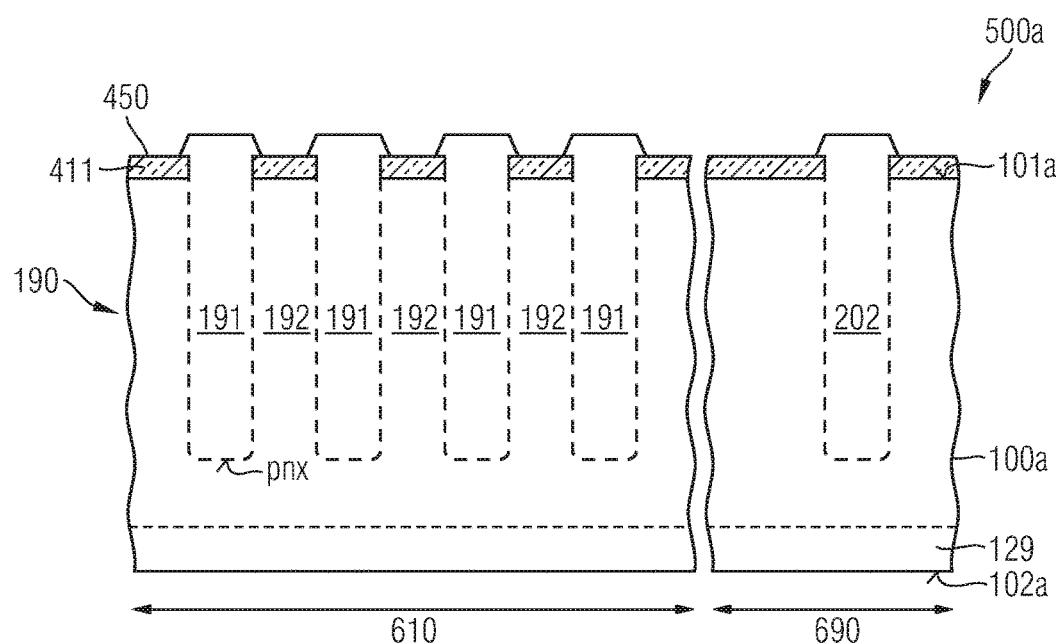
FIG. 2C is a schematic vertical cross-sectional view of the semiconductor substrate portion of FIG. 2B, after filling the first and second trenches with a fill material.

In FIG. 2C structures in the filled first trenches 181 of FIG. 2B form first regions 191 of a superjunction structure 190 and the mesa portions 172 form second regions 192 of the superjunction structure 190. The first and second regions 191, 192 are oppositely doped. The dopant concentrations in and the dimensions of the first and second regions 191, 192 are selected such that the charge carriers in the superjunction structure 190 approximately compensate each other and the superjunction structure 190 fully depletes at voltages below the maximum blocking voltage of a semiconductor device obtained from the semiconductor substrate 500a.

Interfaces between the first and second regions 191, 192 in the device region 610 form compensation pn junctions pnx. In the kerf region 690 the selective epitaxy forms an alignment structure 202 in one or more second trenches 182 of FIG. 2B. The epitaxy also fills the first and second mask openings 418, 419 in the epitaxy mask 450 and may overgrow to some degree the epitaxy mask 450.

A planarization process stopping at the epitaxy mask 450 may remove portions of the fill material deposited outside of the first and second trenches 181, 182 and outside of the first and second mask openings 418, 419 of the epitaxy mask 450 of FIG. 2C. The planarization process may include CMP (chemical mechanical polishing).

Figure 2D:
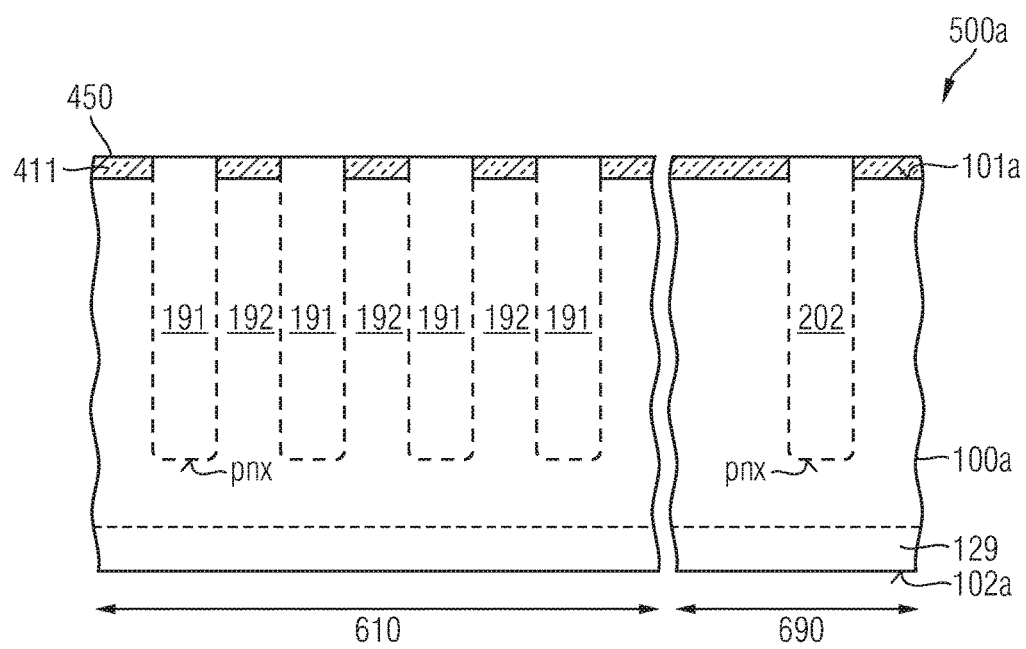
FIG. 2D is a schematic vertical cross-sectional view of the semiconductor substrate portion of FIG. 2C, after planarization of the fill material.

FIG. 2D shows the planarized surface of the semiconductor substrate 500a, wherein top surfaces of the first regions 191 are flush with the exposed surface of the epitaxy mask 450. The top surfaces of the first regions 191 and the exposed surface of the epitaxy mask 450 forms a continuous plane.

A resist layer may be deposited and patterned by photolithography to form a device mask 420 covering at least the device region 610. A mask opening 429 in the device mask 420 exposes a portion of the kerf region 690 around the alignment structure 202 including a second portion of the epitaxy mask 450. Since a distance between the superjunction structure 190 and the alignment structure 202 is significantly greater than a distance between neighboring first regions 191 of the superjunction structure 190, an admissible misalignment of the mask opening 429 in the device mask 420 is comparatively large and the concerned lithography processes are uncritical.

Using the device mask 420 as etch mask, either the exposed second portion of the epitaxy mask 450 may be selectively removed with respect to the fill material of the alignment structure 202 or the fill material of the alignment structure 202 may be recessed with respect to epitaxy mask 450.

FIG. 2F concerns the local removal of the second portion of the epitaxy mask 450 in the kerf region 690, wherein steps 201 are exposed between the main surface 101a and the alignment structure 202. The steps 201 are approximately vertical and have a vertical extension or height hs corresponding to the layer thickness of the epitaxy mask 450, which may be in a range from 50 nm to 2 µm, for example in a range from 100 nm to 500 nm. The patterned surface around the projecting alignment structure 202 and including the steps 201 forms a contrast-enhanced alignment mark 200. Due to the sharp-edged steps 201 and the significant height of the steps 201 the alignment mark 200 provides high optic contrast.

In the device region 610, a remnant first portion of the epitaxy mask 450 is removed together with portions of the fill material in the same horizontal plane such that (i) a resulting surface in the device region 610 remains planar and (ii) the steps 201 of the contrast-enhanced alignment mark 200 are preserved. For example, a plasma etch process may uniformly lower the planar surface in the device region 610 and the stepped surface in the kerf region 690 irrespective of the different materials of the epitaxy mask 450 and the first regions 191. For example, the plasma process may etch an epitaxy mask 450 of silicon oxide and crystalline silicon of the first regions 191 at the same rate.

FIG. 2G shows the planar surface of the superjunction structure 190 forming part of a foundation in the device region 610 as well as the preserved steps 201 of the contrast-enhanced alignment mark 200 in the kerf region 690.

An optical method may capture position information based on the contrast-enhanced alignment mark 200. For example, the optical method captures an image of the contrast-enhanced alignment mark 200 and may bring the image in agreement with predefined position information to align the semiconductor substrate 500a with an exposure tool used for patterning a superstructure on the foundation including the superjunction structure 190.

One or more opaque layers that image the contour of the alignment mark 200 in an exposed surface of the one or more opaque layers may cover the alignment mark 200, wherein a surface relief of the one or more opaque layers may distort and/or shift the contour of the alignment mark 200 in a reproducible and predictable way.

Alternatively or in addition, layers which are transparent in an inspection wavelength range used by exposure tools for evaluating alignment marks may cover the alignment mark 200. The transparent layers may be gap-filling layers that do not at all image the shape of the alignment mark into a surface relief in the exposed surface of the one or more transparent layers or image the shape of the alignment mark only in a not reproducible and not predictable way.

For example, an epitaxial layer 100b may be formed on the main surface 101a and images the alignment mark 200 on an exposed epitaxy surface 101b in a reproducible way. A conformal gate dielectric layer 151a may be formed by thermal oxidation on the exposed epitaxy surface 101b and a conformal conductive layer 155a, e.g., a doped polycrystalline silicon layer may be formed on the conformal gate dielectric layer 151a.

FIG. 2H shows the epitaxial layer 100b with a thickness less than 5 µm, e.g., less than 3 µm, the conformal gate dielectric layer 151a as well as the conformal conductive layer 155a imaging the alignment mark 200 into an exposed surface of the conformal conductive layer 155a.

By using the optical response from the contrast-enhanced alignment mark 200 imaged into the exposed surface of the conformal conductive layer 155a masks for forming the superstructure, e.g., for patterning elements of transistor cells TC can be precisely aligned to the foundation.

For example, after deposition of a gate mask layer on the conformal conductive layer 155a a photolithography process may evaluate the optical response of the contrast-enhanced alignment mark 200 to form a gate mask 430 with gate mask openings 439 in the vertical projection of the first regions 191 of the superjunction structure 190. By using the gate mask 430 as etch mask for anisotropic etching, gate structures 150 may be formed from the conformal conductive layer 155a.

Figure 2I:
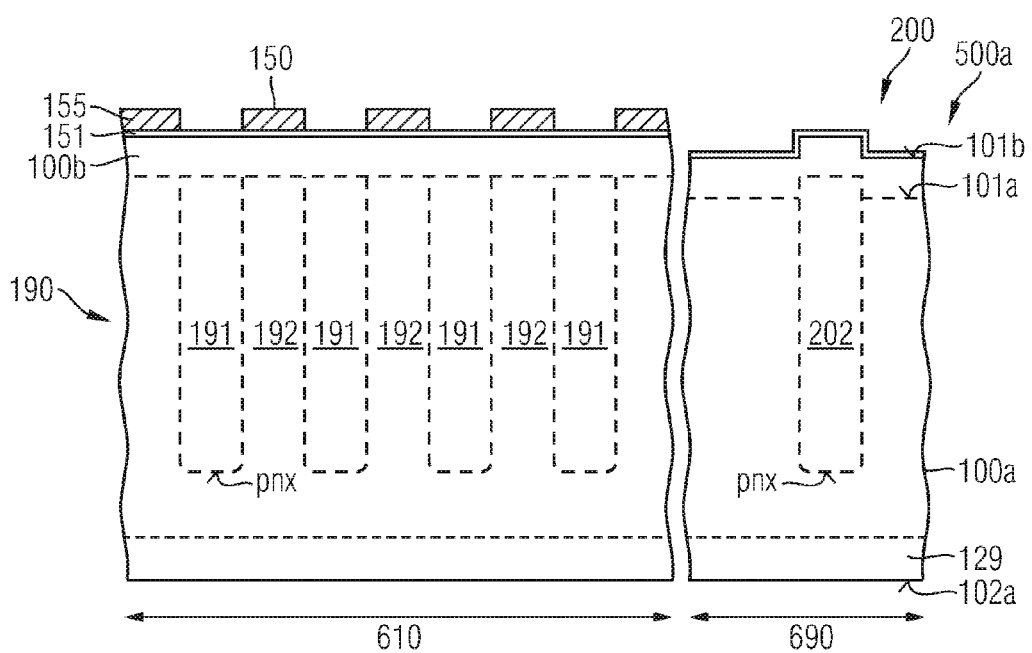
FIG. 2I is a schematic vertical cross-sectional view of the semiconductor substrate portion of FIG. 2H, after forming gate structures by using the gate mask.

FIG. 2I shows the gate structures 150 formed from the conformal conductive layer 155a. Due to the strong high-contrast signal from the contrast-enhanced alignment mark 200, the gate mask 430 can be reliably aligned to the second regions 192 such that distances between the gate structures 150 and the neighboring first regions 191 of the superjunction structure 190 deviate only to a low degree from a mean value. Before or after formation of the to structure 150 the contrast-enhanced alignment mark 200 may also be used for implants for the formation of doped regions of the transistor cells.

Figure 3A:
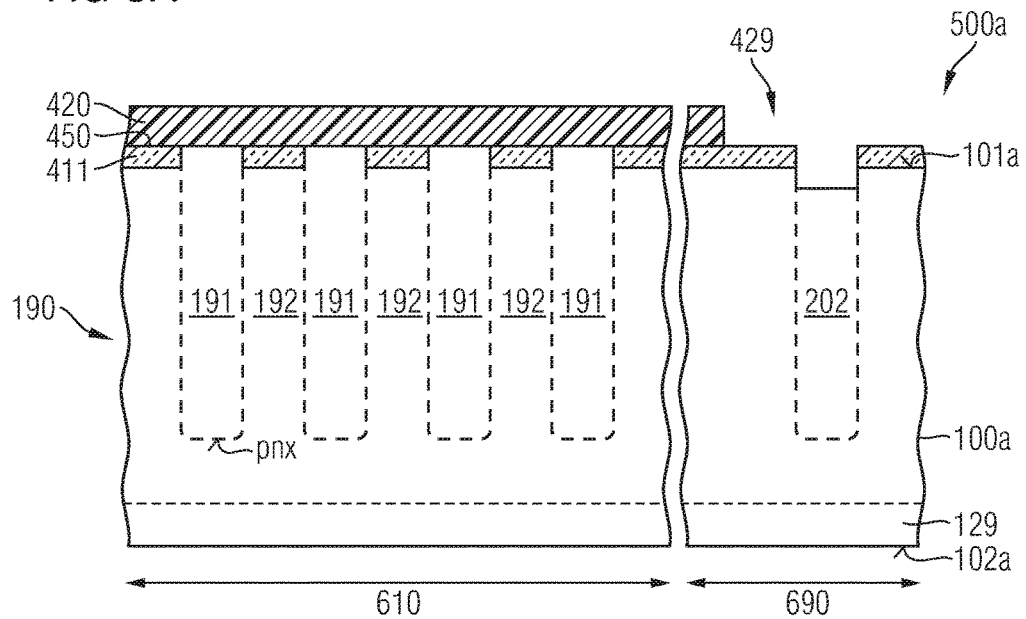
FIG. 3A is a schematic vertical cross-sectional view of a portion of a semiconductor substrate for illustrating a method of manufacturing a superjunction semiconductor device by using a contrast-enhanced alignment mark based on second trenches formed contemporaneously with first trenches provided for formation of a superjunction structure, after recessing fill material in the second trenches with respect to a trench mask.
Figure 3B:
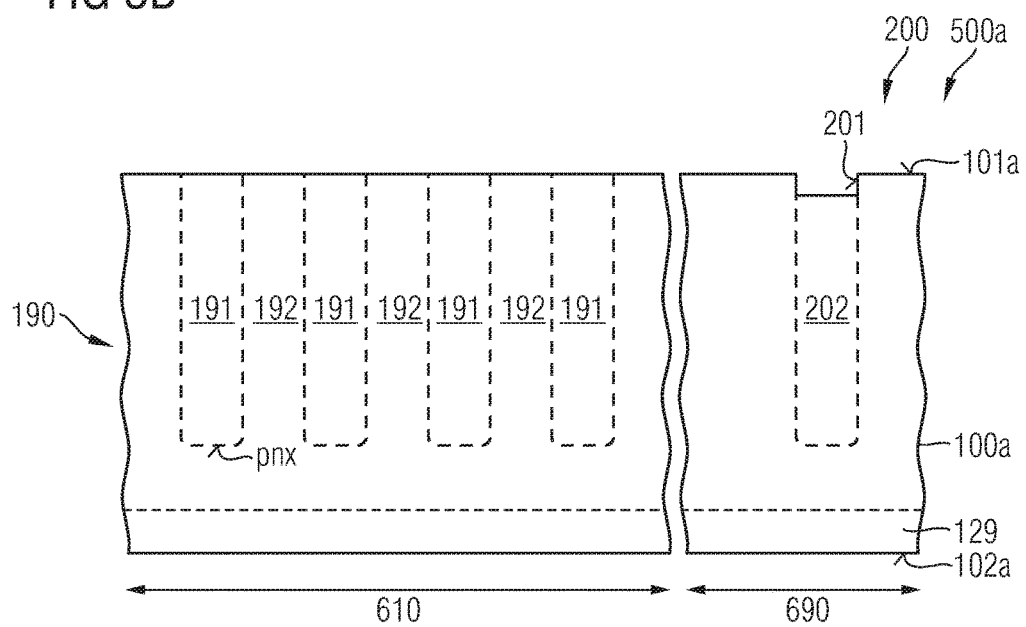
FIG. 3B is a schematic vertical cross-sectional view of the semiconductor substrate portion of FIG. 3A, after complete, non-selective removal of the trench mask.

FIGS. 3A to 3B refer to a selective recess of a second portion of the epitaxy mask 450 in the kerf region 690 as illustrated in FIG. 2F. Instead of the epitaxy mask 450, the masked etch selectively recesses the alignment structure 202 with respect to the epitaxy mask 450. After removal of the device mask 420, a plasma etch process or a planarization process may remove the epitaxy mask 450 non-selectively to the fill-material in both the device region 610 and the kerf region 690.

FIG. 3B shows the resulting contrast-enhanced alignment mark 200 in the kerf region 690 with vertical steps 201 between the recessed alignment structure 202 and the surrounding portion of the semiconductor layer 100a.

The method illustrated in FIGS. 4A to 4H uses different etch properties of the different materials exposed in the device region 610 after the planarization process of FIG. 2D for narrowly defined patterning processes, whereas alignment of less narrowly defined patterning processes for the superstructure may be based on conventional alignment marks or a contrast-enhanced alignment mark 200 as described above.

Narrowly defined patterning processes may directly align portions of the superstructure to single first and second regions 191, 192, e.g., single gate structures to single second regions 192. Less narrowly defined patterning processes may differentiate, e.g., within each device region 610 between a transistor cell area that includes active transistor cells through which a load current flows in an on-state on the one hand and a termination area without active transistor cells on the other hand. Less narrowly defined patterning processing may also be processes using intermediate structures for increasing the allowable range for horizontal deviations.

A superjunction structure 190 may be formed in the semiconductor layer 100a of a semiconductor substrate 500a as described with reference to FIGS. 2A to 2D. An auxiliary mask layer, e.g., a resist layer may be deposited and patterned by photolithography to form a transistor cell area mask 460.

As illustrated in FIG. 4A, the transistor cell area mask 460 may cover a termination area 619 of a device region 610, wherein the termination area 619 may directly adjoin to a kerf region and wherein the superjunction structure 190 extends into a portion of the termination area 619. A mask opening 461 of the transistor cell area mask 460 exposes a transistor cell area 611.

Using the transistor cell area mask 460 as etch mask, different etch characteristics of the epitaxy mask 450 and the crystalline semiconductor material of the first regions 191 are used to generate steps 203 in the transistor cell area 611. For example, a portion of the epitaxy mask 450 in the transistor cell area 611 may be locally removed with respect to the crystalline semiconductor material of the first regions 191 or the crystalline semiconductor material of the first regions 191 may be selectively recessed with respect to the epitaxy mask 450.

According to the embodiment illustrated in FIG. 4B, the portion of the epitaxy mask 450 in the transistor cell area 611 is removed to form steps 203 between the first regions 191 and the second regions 192 of the superjunction structure 190.

A plasma etch may remove a portion of the epitaxy mask 450 in the termination area 619 and uniformly lower the surface in the termination area 619 and the transistor cell area 611 without planarizing the steps 203 in the transistor cell area 611.

FIG. 4C shows the preserved steps 203 in the transistor cell area 611 and the planar termination area 619, from which a portion of the epitaxy mask 450 in the termination area 619 has been removed.

A conformal mask layer 470a may be deposited that lines the steps 203 between the first and second regions 191, 192 of the superjunction structure 190. The conformal mask layer 470a may be an oxide layer, for example a silicon oxide layer formed by using TEOS as precursor material.

FIG. 4D shows the conformal mask layer 470a covering the main surface 101a and lining the steps 203 in the transistor cell area 611 at uniform layer thickness. A layer thickness of the conformal mask layer 470a may be in a range of 5% to 45% of the width of the second regions 192, e.g., in a range from 50 nm to 1 µm. In the transistor cell area 611, the conformal mask layer 470a lines notches 473 in the vertical projection of the second regions 192, wherein a width of the notches 473 is equal to the width of the second regions 192 reduced by two times the layer thickness of the conformal mask layer 470a.

An auxiliary mask layer may be deposited and patterned by photolithography to form an auxiliary hardmask 480 that at least covers completely portions of the conformal mask layer 470a in the vertical projection of the first regions 191. Mask openings 481 in the auxiliary hardmask 480 expose at least the notches 473 lined by the conformal mask layer 470a. Alignment of the auxiliary hardmask 480 allows comparatively high deviations in a range of half of the layer thickness of the conformal mask layer 470a and is a less narrowly defined patterning process.

Patterning the auxiliary hardmask 480 may use (i) a conventional alignment mark formed before or after formation of the superjunction structure 190, (ii) an alignment mark as described with reference to FIG. 2E or 3B or may use (iii) a signal from the imaged steps 203 in the transistor cell area 611 for adjusting the mask openings 481 to the superjunction structure 190.

Figure 4E:
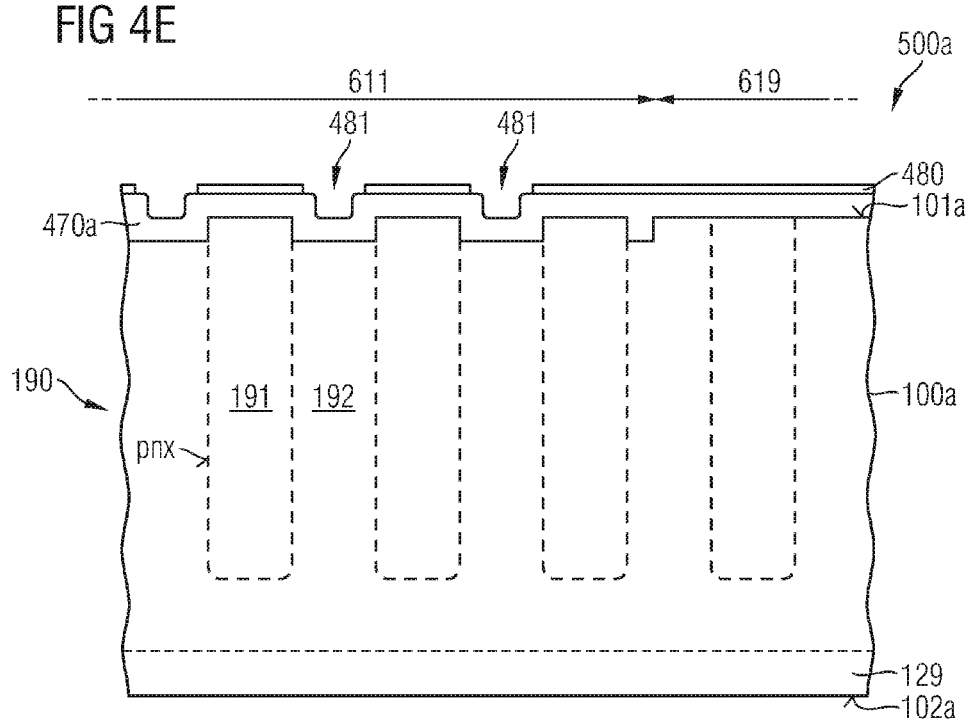
FIG. 4E is a schematic vertical cross-sectional view of the semiconductor substrate portion of FIG. 4D, after forming an auxiliary mask.

As illustrated in FIG. 4E, mask openings 481 in the auxiliary hardmask 480 expose the notches 473 lined by the conformal mask layer 470a. The auxiliary hardmask 480 may consist of or include a silicon nitride layer.

A high anisotropic etch of the material of the conformal mask layer 470a with high etch selectivity against the material of the auxiliary hardmask 480 forms a spacer mask 470 from the conformal mask layer 470a.

Figure 4F:
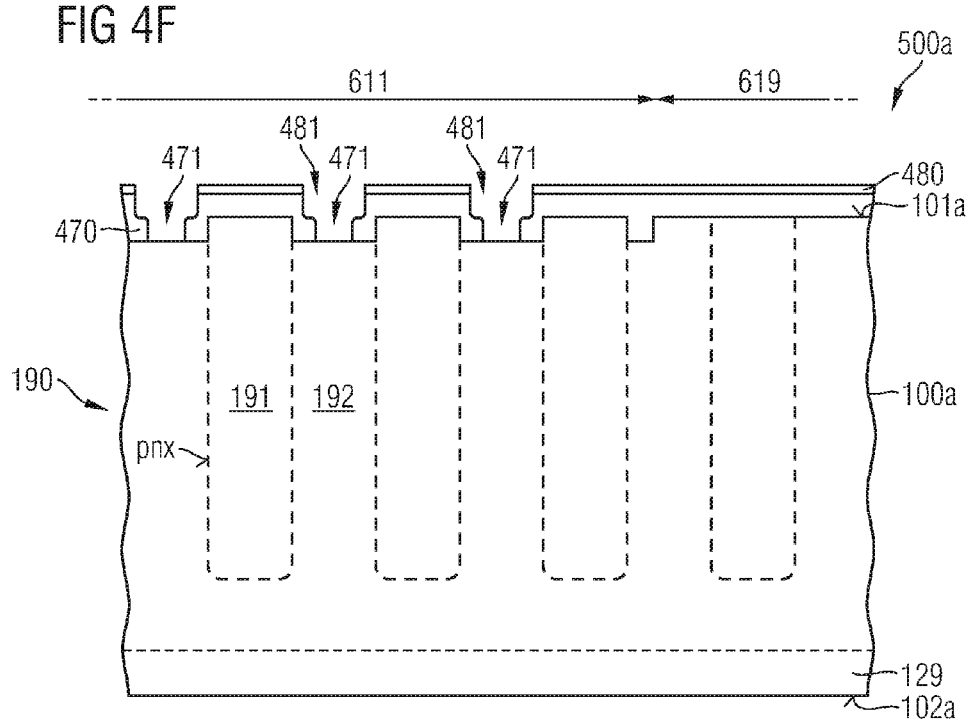
FIG. 4F is a schematic vertical cross-sectional view of the semiconductor substrate portion of FIG. 4E, after forming, by using the auxiliary mask, a spacer mask from the conformal mask layer.

According to FIG. 4F, the spacer mask 470 includes spacer mask openings 471, which, subject to sufficiently aligned mask openings 481 in the auxiliary hardmask 480, are self-aligned to neighboring first regions 191.

Gate trenches 150a may be etched into the semiconductor layer 100a, wherein the spacer mask 470 is effective as etch mask.

Figure 4G:
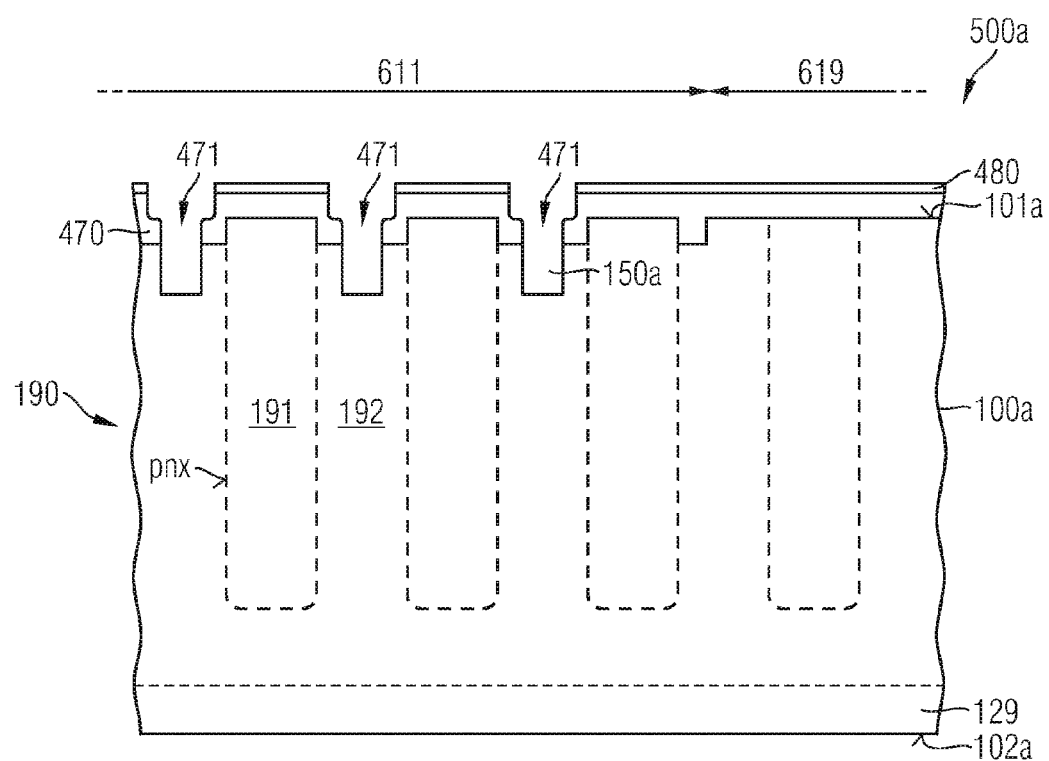
FIG. 4G is a schematic vertical cross-sectional view of the semiconductor substrate portion of FIG. 4F, after forming gate trenches self-aligned to first regions formed in the first trenches.

FIG. 4G shows the gate trenches 150a formed in the second regions 192 in a vertical projection of the spacer mask openings 471. The gate trenches 150a have the same distance to both neighboring first regions 191.

Figure 4H:
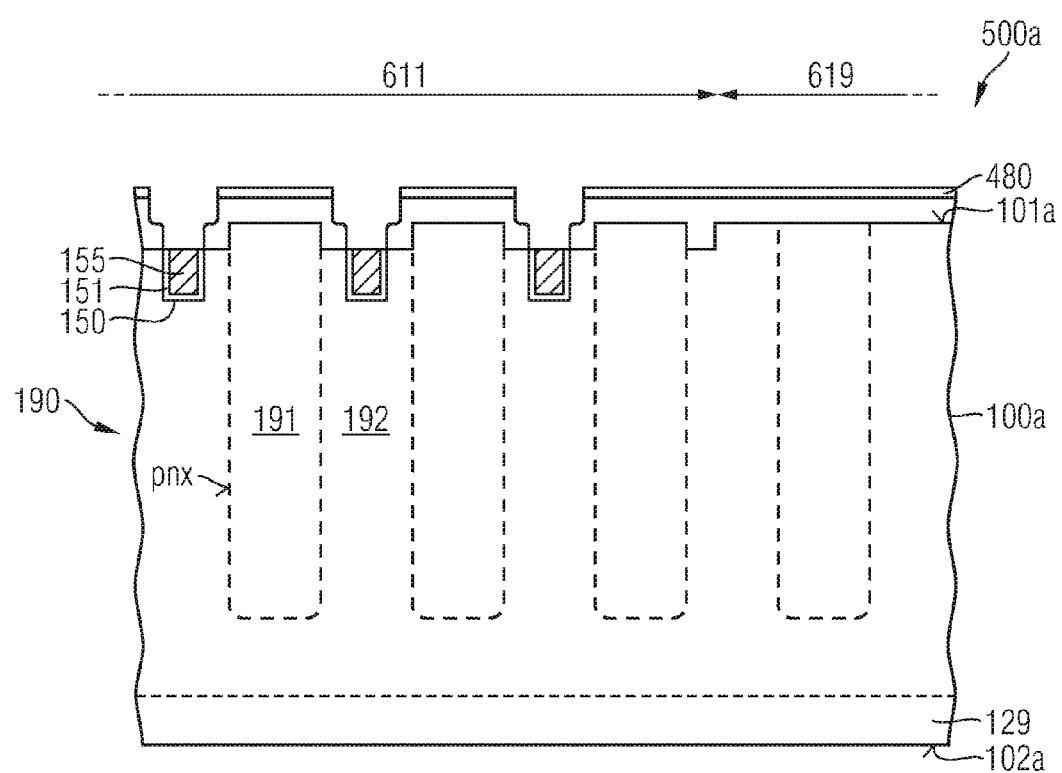
FIG. 4H is a schematic vertical cross-sectional view of the semiconductor substrate portion of FIG. 4G, after forming gate structures in the gate trenches.

FIG. 4H shows gate structures 150 formed in the gate trenches 150a and including a conductive gate electrode 155 and a gate dielectric 151 separating the gate electrode 155 from the semiconductor layer 100a. Based on the gate trenches 150a or based on structures derived from the spacer mask 470 or the gate trenches 150a doped regions and contacts for transistor cells may be formed before or after formation of the gate structures 150.

Though the embodiment may use an alignment mark for the formation of the auxiliary hardmask 480, the gate trenches 150a are formed self-aligned to the superjunction structure 190 and without exposure, and narrow alignment tolerances can be satisfied as long as the comparatively non-critical tolerance condition for the mask openings 481 in the auxiliary hardmask 480 is fulfilled, i.e., as long as the misalignment is to a considerable degree less than the thickness of the conformal mask layer 470a.

Figure 5A:
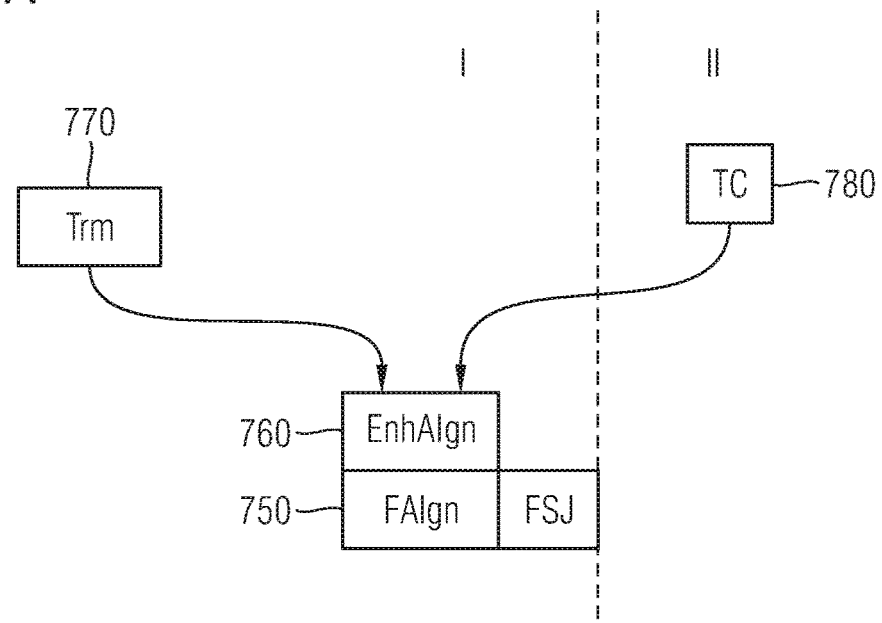
FIG. 5A is a diagram schematically illustrating alignment dependencies for the method as illustrated in FIGS. 2A to 3B according to an embodiment.
Figure 5B:
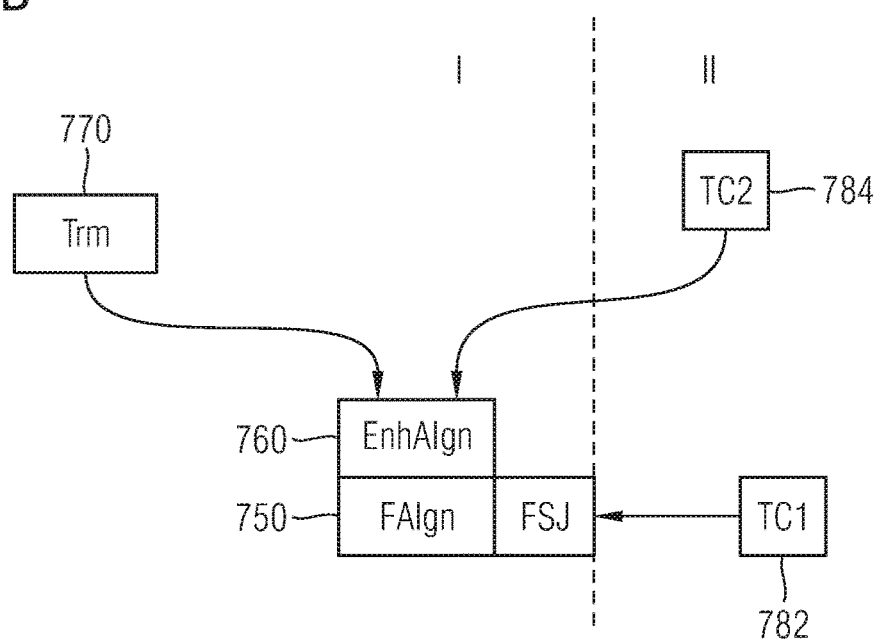
FIG. 5B is a diagram schematically illustrating alignment dependencies for the method as illustrated in FIGS. 4A to 4H according to another embodiment.

FIGS. 5A and 5B show alignment dependencies for first patterning processes I for forming a foundation that includes a superjunction structure and second patterning processes II for the formation of a superstructure that may include transistor cells, wherein the superstructure may be formed at least partly in an epitaxial layer grown onto the foundation after formation of the superjunction structure.

A first lithography process 750 defines, in a foundation I, a superjunction structure FSJ and an alignment mark FAlgn that are contemporaneously formed. The superjunction structure FSJ and the alignment mark FAlgn result from the same exposure process. From the alignment mark FAlgn, a contrast enhancement process 760 forms a contrast-enhanced alignment mark EnhAlgn, wherein no or only low-critical lithography processes are used. Second lithography processes 770 form termination structures Trm, e.g., JTEs (junction termination extensions) by using exposure masks that may be aligned to the contrast-enhanced alignment mark EnhAlgn. Alternatively, the termination structures Trm may be aligned to the original alignment mark FAlgn and the contrast-enhanced alignment mark EnhAlgn is formed only at the end of the patterning processes concerning the foundation I. Third lithography processes 780 may define, inter alia, transistor cells TC in a superstructure II by using exposure masks brought into alignment with the contrast-enhanced alignment mark EnhAlgn.

In FIG. 5A all third lithography processes 780 effective on the superstructure II may be aligned to the contrast-enhanced alignment mark EnhAlgn.

In FIG. 5B a first subset 782 of the third lithography processes 780 may be formed self-aligned to the superjunction structure FSJ and without using a further exposure process. A second subset 784 of the third lithography processes 780 with relaxed tolerance constraints may be based on any of the previously formed alignment marks, e.g., on the contrast-enhanced alignment mark EnhAlgn.

FIG. 6 shows a semiconductor substrate 500a for the manufacture of superjunction semiconductor devices, which may be or may include IGFETs, IGBTs, or power semiconductor diodes. The semiconductor substrate 500a may be a semiconductor wafer at any processing stage after formation of (i) superjunction structures 190 in a plurality of device regions 610 and (ii) at least one contrast-enhanced alignment mark 200 in a kerf region 690, wherein the kerf region 690 forms a grid enclosing single device regions 610 in the meshes.

The semiconductor substrate 500a may consist of or may include a semiconductor layer 100a of a semiconductor material such as crystalline silicon. The semiconductor substrate 500a may include further conductive, dielectric or semiconducting portions. For example, the semiconductor layer 100a is an n-doped epitaxial layer formed on a substrate portion 105a obtained from a semiconductor ingot. The substrate portion 105a may be thinned or completely removed during processing.

The semiconductor layer 100a may include a drift structure 120 of a first conductivity type. A dopant concentration in the drift structure 120 may gradually or in steps increase or decrease with increasing distance to a main surface 101a of the semiconductor layer 100a at a front side of the semiconductor substrate 500a at least in portions of its vertical extension. According to other embodiments the dopant concentration in the drift structure 120 may be approximately uniform. A mean dopant concentration in the drift structure 120 may be between $5E12$ cm$^{-3}$ and $1E15$ cm$^{-3}$, for example in a range from $5E13$ cm$^{-3}$ to $5E14$ cm$^{-3}$.

In the device regions 610, the drift structure 120 includes superjunction structures 190 effective as compensation structures and including first regions 191 of a first conductivity type and second regions 192 of a complementary second conductivity type. The first regions 191 may be formed by depositing a fill material containing suitable dopants into trenches temporarily formed in the drift structure 120, by depositing a doped semiconductor layer along sidewalls of temporary trenches or by diffusing dopants out from the semiconductor layer 100a into low-doped or intrinsic semiconductor material filling temporary trenches, by way of example. The second regions 192 may result from more heavily doped portions of the drift structure 120 between the trenches, by depositing a doped semiconductor layer along sidewalls of temporary trenches, by diffusing dopants out from the semiconductor layer 100a into low-doped or intrinsic semiconductor material filling temporary trenches, or by depositing fill material containing suitable dopants in temporary trenches, by way of example. The fill material may be, e.g., doped single-crystalline semiconductor material.

The first and second regions 191, 192 alternate along at least one horizontal direction. According to an embodiment, surfaces that connect points of equal dopant concentration in the first and second regions 191, 192 are not undulated and do not show concave portions or notches as surfaces do that connect points or equal dopant concentration in the semiconductor regions of superjunction structures resulting from a multi-epitaxial/multi-implant process.

The integrated areal dopant concentrations across the first and across the second regions 191, 192 are approximately equal such that the effects of complementary charge carriers cancel out each other to a high degree and a portion of the drift structure 120 including the superjunction structure 190 can be completely depleted in a blocking state of semiconductor devices obtained from the semiconductor substrate 500a.

Portions of transistor cells or complete transistor cells may be formed in portions of the device regions 610 along the main surface 101a. The illustrated embodiment refers to a process stage of the semiconductor substrate 500a after formation of gate structures 150 in the device regions 610.

The gate structures 150 may be lateral gates formed outside or the semiconductor layer 100a along the main surface 101a as illustrated. According to another embodiment the gate structures 150 may be trench gates extending from the first surface 101 into the semiconductor layer 100a.

The gate structures 150 may include a conductive gate electrode 155 which may include or consist of a heavily doped polycrystalline silicon layer or a metal-containing layer. The gate structures 150 further include a gate dielectric 151 separating the gate electrode 155 from the semiconductor portion 100. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The kerf region 690 includes a contrast-enhanced alignment mark 200 with vertical or approximately vertical steps 201. The steps 201 are formed along sidewalls of an alignment structure 202 that protrudes from a directly adjoining portion of the semiconductor layer 100a.

The portion of the semiconductor layer 100a directly adjoining to the alignment structure 202 may be recessed with respect to a portion of the semiconductor layer 100a including the superjunction structure 190. A surface of the alignment structure 202 may be flush with the corresponding surface of the superjunction structure 190. A vertical extension hs of the step 201 is at least 50 nm, for example, at least 200 nm.

The material of the alignment structure 202 is the same as that of the first regions 191 of the superjunction structures 190 in the device regions 610, e.g., doped crystalline semiconductor material such as single-crystalline silicon, which may be p-doped and that may result from an epitaxy process.

The dimensions of the alignment structure 202 may be the same as that of the first regions 191 in the superjunction structures 190 or may deviate therefrom. A horizontal cross-section of the alignment structure 202 parallel to the first surface 101 may be a rectangle.

The alignment mark 200 may include a plurality of separated alignment structures 202 which may be arranged parallel to each other, as a cross or as a rectangle, by way of example.

The alignment mark 200 may be exposed, may be covered by one or more opaque layers imaging the step 201 into the exposed surface of the one or more opaque layers, and/or may be covered by a gap-filling layer that is transparent at an inspection wavelength or in an inspection wavelength range used by an exposure tool for obtaining position information about the alignment mark 200.

In the illustrated embodiment, an epitaxial layer 100b with a thickness of less than 10 μm and formed on the main surface 101a images the original alignment mark 200 into an epitaxy surface 101b and a conformal and transparent silicon oxide layer forming the gate dielectric in the device region 610 covers the alignment mark 200 imaged into the epitaxy surface 101b. Further dielectric layers, e.g., an interlayer dielectric that includes layers of silicon oxide and/or silicate glasses may cover the gate structures 150 and the alignment mark 200 imaged into the epitaxy surface 101b.

FIG. 7 shows a semiconductor device 500, which may be or may include an IGFET, an IGBT, or a power semiconductor diode. In an active region 614 of the semiconductor device 500 functional transistor cells TC or an anode zone of a power semiconductor diode are formed through which a load current directly flows in an on-state or forward mode of the semiconductor device 500. An inactive region 615 is devoid of functional transistor cells and devoid of an anode zone of a power semiconductor diode and in an on-state or forward mode no load current flows directly through the inactive region 615. The inactive region 615 may be a portion of the semiconductor device 500 in or beyond a termination area or below gate conductors, by way of example. According to an embodiment, the inactive region 615 may be a remnant of a kerf region. The inactive region 615 includes a contrast-enhanced alignment mark 200 as discussed above.

The semiconductor device 500 may include a semiconductor portion 100 of a semiconductor material such as crystalline silicon. The semiconductor portion 100 may include a drift structure 120 with a superjunction structure 190 including first and second regions 191, 192 as described with reference to FIG. 6 and may include further conductive, dielectric or semiconducting portions.

Transistor cells TC may be formed in the semiconductor portion 100 along a first surface 101. The transistor cells TC may be based on trench gates or planar gates with gate structures 150 as described with reference to FIG. 6.

The transistor cells TC include body zones 115 of the second conductivity type. The body zones 115 form first pn junctions pn1 with the second regions 192 of the superjunction structure 190 and second pn junctions pn2 with source zones 110. The body zones 115 may be wells extending from the first surface 101 into the semiconductor portion 100. The source zones 110 may be wells extending from the first surface 101 into the body zones 115. The source zones 110 and the body zones 115 may be electrically connected to a first load electrode L1. The gate dielectric 151 capacitively couples the gate electrode 155 to channel portions of the body zones 115.

Along a second surface 102 opposite to the first surface 101 the semiconductor portion 100 may include a heavily doped contact layer 129 electrically connected to a second load electrode 12. A field stop layer 128 with a lower dopant concentration as the contact layer 129 may be sandwiched between the contact layer 129 and a low doped drift zone 121.

The inactive region 615 includes an alignment mark 200 as described with reference to FIG. 6. An interlayer dielectric 210 may cover the alignment mark 200 and the gate structures 150.

FIG. 8A shows an alignment mark 200 with several parallel alignment structures 202.

Figure 8B:
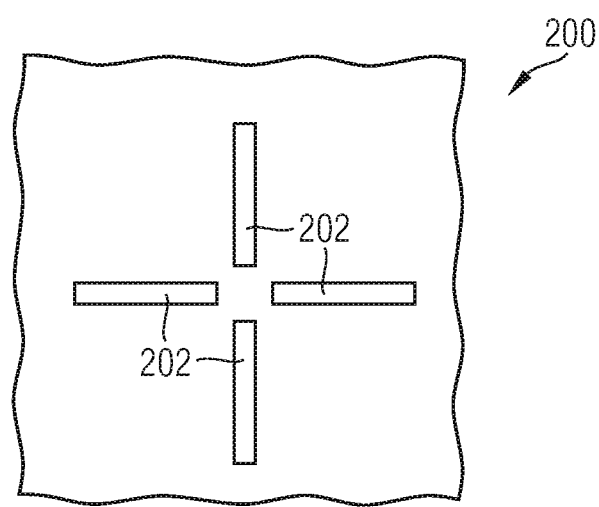
FIG. 8B is a schematic plan view of a cross-shaped alignment mark according to an embodiment.

In FIG. 8B the alignment mark 200 includes four separated alignment structures 202 arranged to form a cross.

Figure 8C:
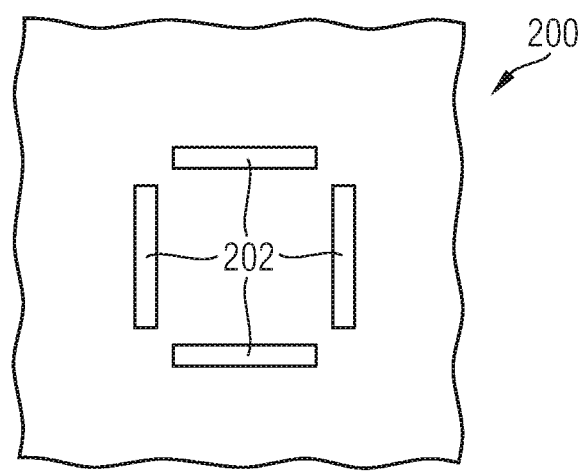
FIG. 8C is a schematic plan view of a box-shaped alignment mark according to an embodiment.

In FIG. 8C four separated alignment structures 202 form a rectangular frame.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a trench mask by forming mask openings in a trench mask layer on a semiconductor layer;
    forming, by using the trench mask, first and second trenches extending in a vertical projection of the mask openings from a main surface into the semiconductor layer;
    forming a foundation comprising first regions in and/or directly adjoining the first trenches, wherein a fill material forming structures in the first and second trenches fills the mask openings;
    performing an etch process selective with respect to the fill material to form at least one of steps at the first trenches in a device region and steps at the second trenches in a kerf region; and
    forming a superstructure in alignment with the foundation by using position information directly obtained from the steps.

2. The method of claim 1, further comprising:
    selectively removing the trench mask with respect to the fill material in the mask openings to form the steps exposing sidewalls of the fill material.

3. The method of claim 1, further comprising:
    selectively recessing the fill material with respect to the trench mask to form the steps exposing sidewalls of the semiconductor layer.

4. The method of claim 1, further comprising:
    forming a spacer mask with mask spacers along sidewalls of the steps and a spacer mask opening between the steps.

5. The method of claim 4, further comprising:
    forming a gate trench in the semiconductor layer in a vertical projection of the spacer mask opening.

6. The method of claim 1, wherein the position information is derived, by using an optical method, from alignment structures, which are formed by filling the second trenches, wherein the alignment structure is a portion of an alignment mark.

7. The method of claim 6, further comprising:
    detecting position information from the alignment structure to align a photomask for patterning gate structures in alignment to the alignment mark.

8. The method of claim 6, wherein forming the alignment structure comprises:
    selectively removing a second portion of the trench mask, the second portion of the trench mask directly adjoining to the alignment structure, with respect to a first portion of the trench mask directly adjoining to the first regions.

9. The method of claim 8, wherein selectively removing the second portion of the trench mask comprises:
    depositing a device mask on the trench mask and patterning the device mask by photolithography, wherein a minimum distance between neighboring first and second trenches is greater than a distance between neighboring first trenches.

10. The method of claim 8, further comprising:
    evenly stripping the first portion of the trench mask and exposed portions of the first regions at a same removal rate.

11. The method of claim 10, wherein the trench mask contains silicon oxide, the fill material forming the first region is crystalline silicon and evenly stripping the trench mask and the fill material comprises plasma etching.

12. The method of claim 1, wherein the first regions are doped regions of a first conductivity type.

13. The method of claim 12, further comprising:
    forming doped second regions in the semiconductor layer.

14. The method of claim 13, wherein the first and second regions form a superjunction structure.

15. A method of manufacturing a semiconductor device, the method comprising:
    forming a trench mask by forming mask openings in a trench mask layer formed on a semiconductor layer;
    forming, by using the trench mask, first and second trenches extending in a vertical projection of the mask openings from a main surface into the semiconductor layer, wherein the first trenches are formed in a device region and the second trenches are formed in a kerf region;
    forming a foundation comprising a superjunction structure, the superjunction structure comprising doped first regions in and/or directly adjoining the first trenches and oppositely doped second regions, the first and second regions alternating along at least one horizontal direction parallel to the main surface, wherein a fill material forming structures in the first and second trenches fills the mask openings;
    in at least one of the kerf region and the device region, (i) removing the trench mask with respect to the fill material in the mask openings to form steps exposing sidewalls of the fill material or (ii) recessing the fill material with respect to the trench mask to form steps exposing sidewalls of the semiconductor layer; and forming a superstructure in alignment with the foundation by using position information directly obtained from structures formed in at least one of the first and the second trenches.

* * * * *